(12) United States Patent
Yamamoto et al.

(10) Patent No.: US 7,157,157 B2
(45) Date of Patent: Jan. 2, 2007

(54) ORGANIC EL ELEMENT AND ORGANIC EL DISPLAY

(75) Inventors: Kazushige Yamamoto, Yokohama (JP); Mikio Nakasuji, Kawasaki (JP)

(73) Assignees: Kabushiki Kaisha Toshiba, Tokyo (JP); Toshiba Matsushita Display Technology Co., Ltd., Tokyo (JP)

( * ) Notice: Subject to any disclaimer, the term of this patent is extended or adjusted under 35 U.S.C. 154(b) by 0 days.

(21) Appl. No.: 11/132,393

(22) Filed: May 19, 2005

(65) Prior Publication Data

US 2005/0214578 A1 Sep. 29, 2005

Related U.S. Application Data

(63) Continuation of application No. PCT/JP03/14706, filed on Nov. 19, 2003.

(30) Foreign Application Priority Data

Nov. 20, 2002 (JP) .............................. 2002-336962

(51) Int. Cl.
*H01L 51/50* (2006.01)
*H05B 33/12* (2006.01)

(52) U.S. Cl. ...................... 428/690; 428/917; 428/212; 313/503; 313/506; 257/89

(58) Field of Classification Search ................ 428/690, 428/917, 212; 313/503, 506; 257/89
See application file for complete search history.

(56) References Cited

U.S. PATENT DOCUMENTS

| 5,739,545 A | 4/1998 | Guha et al. |
| 5,776,622 A | 7/1998 | Hung et al. |
| 5,891,554 A * | 4/1999 | Hosokawa et al. ......... 428/212 |
| 6,255,774 B1 * | 7/2001 | Pichler ....................... 313/504 |
| 6,525,465 B1 * | 2/2003 | Fujita .......................... 313/504 |
| 6,849,869 B1 * | 2/2005 | O'Regan et al. .............. 257/40 |
| 2002/0043934 A1 * | 4/2002 | Tanaka ........................ 313/512 |

FOREIGN PATENT DOCUMENTS

| JP | 10-74586 | 3/1998 |
| JP | 2000-164359 | 6/2000 |
| JP | 2000-223277 | 8/2000 |
| JP | 2003-68471 | 3/2003 |

OTHER PUBLICATIONS

JPO English abstract for JP 2003068471, publication date Mar. 7, 2003.*
JPO English abstract for JP 2000223277, publication date Aug. 11, 2000.*
JPO English abstract for JP 2000164359, publication date Jun. 16, 2000.*
JPO English abstract for JP 10074586, publication date Mar. 17, 1998.*

* cited by examiner

*Primary Examiner*—Dawn Garrett
(74) *Attorney, Agent, or Firm*—Oblon, Spivak, McClelland, Maier & Neustadt, P.C.

(57) ABSTRACT

There is provided an organic EL element including an anode, a cathode, and an organic layer, wherein the cathode includes a protective conductor layer which faces the organic layer, a main conductor layer which is interposed between the protective conductor layer and the organic layer, and a barrier layer which is interposed between the protective conductor layer and the main conductor layer and made of an insulator or a semiconductor.

23 Claims, 4 Drawing Sheets

ORGANIC EL ELEMENT AND ORGANIC EL DISPLAY

CROSS REFERENCE TO RELATED APPLICATIONS

This is a Continuation Application of PCT Application No. PCT/JP03/14706, filed Nov. 19, 2003, which was published under PCT Article 21(2) in Japanese.

This application is based upon and claims the benefit of priority from prior Japanese Patent Application No. 2002-336962, filed Nov. 20, 2002, the entire contents of which are incorporated herein by reference.

BACKGROUND OF THE INVENTION

1. Field of the Invention

The present invention relates to an organic EL (electroluminescent) element and organic EL display.

2. Description of the Related Art

Along with the recent development of the information society, various kinds of mobile devices and terminal devices are increasingly becoming popular. Demand for reduction of power consumption in displays mounted on the devices is growing ever.

An organic EL element is a self-emission element and constitutes a light-emitting diode in which an organic layer including a light-emitting layer is sandwiched between a cathode and an anode.

The organic EL element can emit light upon application of a low voltage of 10 V or less. The organic EL element can also realize various emission colors including three colors: blue, green, and red. From these viewpoints, organic EL displays have received a great deal of attention as flat panel displays of next generation that should replace liquid crystal displays. However, many organic EL displays reduce by half the luminance within 10,000 hrs. That is, no current organic EL displays have a sufficient long panel life, unlike liquid crystal displays.

A luminance half-life $\tau$ of an organic EL element is closely related to its drive current density J necessary for obtaining a desired panel front luminance L on an organic EL display. As is experimentally known, the luminance half-life $\tau$ can be expressed by $$\tau \propto 1/J = \eta/L \qquad (1)$$

where $\eta$ is the luminous efficiency of the organic EL element.

As is apparent from equation (1), the higher the drive current density becomes, the faster luminance degradation progresses. To increase the reliability or life of the organic EL element while maintaining the luminance L at a predetermined value, the luminous efficiency $\eta$ should be increased.

The luminous efficiency $\eta$ of the organic EL element is given by $$\eta = \Phi_{e-h} \times \Phi_R \times \Phi_{OUT} \qquad (2)$$

where $\Phi_{e-h}$ is the electron/hole injection balance, $\Phi_R$ is the recombination radiation efficiency of the light-emitting layer material, and $\Phi_{OUT}$ is the outcoupling efficiency. $\Phi_R$ is a value determined by the light emission capability of each of the R, G, and B light-emitting materials. $\Phi_{OUT}$ is a value determined by the three-dimensional structure of the device. To increase the luminous efficiency $\eta$ without changing the materials and device structure, it is effective to improve the electron/hole injection balance $\Phi_{e-h}$.

Figure 1:
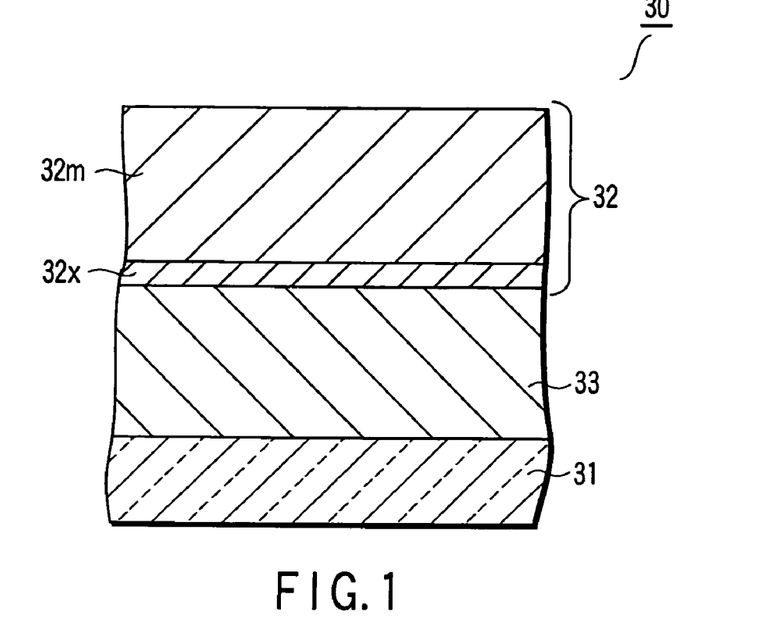
FIG. 1 is a sectional view schematically showing a conventional organic EL element.

To increase the electron/hole injection balance $\Phi_{e-h}$, generally, the cathode structure is optimized. For example, Jpn. Pat. Appln. KOKAI Publication No. 10-74586 describes, as the cathode of an organic EL element 30, a two-layered cathode having an Y/X structure including a contact layer (referred to as an X layer hereinafter) 32x and a cathode conductor layer (referred to as an Y layer hereinafter) 32y, as shown in FIG. 1. Referring to FIG. 1, reference numeral 31 denotes an anode; and 33, an organic layer. Jpn. Pat. Appln. KOKAI Publication No. 2000-164359 describes a three-layered cathode having an M/Y/X structure further including a protective conductor layer (referred to as an M layer hereinafter) 32m on the Y layer, as shown in FIG. 2.

In an Y/X cathode 32 shown in FIG. 1, Al is used as the material of the Y layer 32y, and LiF is used as the material of the X layer 32x. This Al/LiF cathode is a typical cathode used in an organic EL element including a low molecular light-emitting layer. The Al/LiF cathode has a great electron injection ability for an $Alq_3$ electron transporting layer used in combination with the low molecular light-emitting layer. In this structure, $\Phi_{e-h}$ up to 1 has been reported. However, the electron injection ability of the Al/LiF cathode is low for a low molecular electron transporting layer other than $Alq_3$ or a polymer light-emitting layer. According to studies by the present inventors, the electron injection barrier height of the cathode interface, which determines the electron injection amount, largely depends on the type of material used for the X layer 32x. When a polymer light-emitting layer and a LiF layer is combined, the barrier is high, and electrons are hardly injected. For this reason, when an Al/LiF cathode is used, no high luminous efficiency $\eta$ can be realized in a polymer organic EL element or a low molecular organic EL element having an electron transporting layer other than $Alq_3$. Hence, the life is short.

Figure 2:
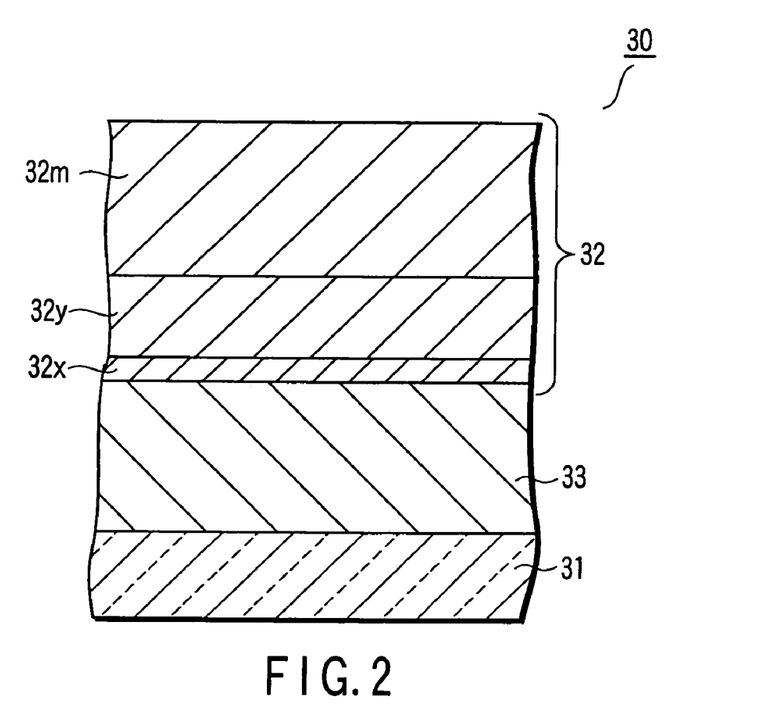
FIG. 2 is a sectional view schematically showing a conventional organic EL element.

On the other hand, in the M/Y/X cathode 32 shown in FIG. 2, Al which is stable and is hardly oxidized is used as the material of the M layer 32m, Ca is used as the material of the Y layer 32y, and LiF is used as the material of the X layer 32x. This Al/Ca/LiF cathode is a typical cathode used in a polymer organic EL element. The Al/Ca/LiF cathode 32 has a structure obtained by adding a Ca layer with a small work function to the above-described Al/LiF cathode 32. Addition of the Ca layer is supposedly done to decrease the electron injection barrier height of the cathode interface to increase the electron injection amount. However, even when the cathode 32 is used, the electron injection ability for a polymer light-emitting layer cannot sufficiently be improved. For this reason, even when an Al/Ca/LiF cathode is used, no high luminous efficiency $\eta$ can be realized in a polymer organic EL element or a low molecular organic EL element having an electron transporting layer other than $Alq_3$, as in the Al/LiF cathode. Hence, the life is short. In addition, the Al/Ca/LiF cathode has a structure obtained by adding a highly chemically reactive Ca layer to the Al/LiF cathode. For this reason, Ca atoms are diffused to the Al layer and LiF layer as time elapses. Accordingly, the life shortens due to degradation of the cathode.

BRIEF SUMMARY OF THE INVENTION

It is an object of the present invention to provide an organic EL element and organic EL display which are excellent in life characteristic.

According to a first aspect of the present invention, there is provided an organic EL element comprising an anode, a cathode which faces the anode, and an organic layer which is interposed between the anode and the cathode and includes a light-emitting layer, wherein the cathode comprises a protective conductor layer which faces the organic layer, a main conductor layer which is interposed between the protective conductor layer and the organic layer, and a first barrier layer which is interposed between the protective conductor layer and the main conductor layer and made of an insulator or a semiconductor.

According to a second aspect of the present invention, there is provided an organic EL element comprising an anode, a cathode which faces the anode, and an organic layer which is interposed between the anode and the cathode and includes a light-emitting layer, wherein the cathode comprises a protective conductor layer which faces the organic layer, a main conductor layer which is interposed between the protective conductor layer and the organic layer and made of a material different from a material of the protective conductor layer, and a first barrier layer which is interposed between the protective conductor layer and the main conductor layer and suppresses diffusion of a constituent element of the protective conductor layer into the main conductor layer.

According to a third aspect of the present invention, there is provided an organic EL element comprising an anode, a cathode which faces the anode, and an organic layer which is interposed between the anode and the cathode and includes a light-emitting layer, wherein the cathode comprises a main conductor layer which faces the organic layer, a contact layer which is interposed between the main conductor layer and the organic layer and made of a semiconductor or an insulator, and a second barrier layer which is interposed between the main conductor layer and the contact layer and made of a semiconductor or an insulator, a material of the contact layer being different from a material of the second barrier layer.

According to a fourth aspect of the present invention, there is provided an organic EL element comprising an anode, a cathode which faces the anode, and an organic layer which is interposed between the anode and the cathode and includes a light-emitting layer, wherein the cathode comprises a main conductor layer which faces the organic layer, a contact layer which is interposed between the main conductor layer and the organic layer and made a semiconductor or an insulator, and a second barrier layer which is interposed between the main conductor layer and the contact layer and suppresses diffusion of a constituent element of the main conductor layer into the contact layer and/or diffusion of a constituent element of the contact layer into the main conductor layer, a material of the contact layer being different from a material of the second barrier layer.

According to a fifth aspect of the present invention, there is provided an organic EL display comprising a plurality of organic EL elements according to any one of the first to fourth aspects, and a substrate which supports the organic EL elements.

According to a sixth aspect of the present invention, there is provided an organic EL display comprising a plurality of organic EL elements according to any one of the first to fourth aspects, and a substrate which supports the organic EL elements, wherein the plurality of organic EL elements include first to third organic EL elements whose light-emitting layers emit light of different colors, a material of the contact layer is the same in the first to third organic EL elements, and a material of the second barrier layer is the same in the first to third organic EL elements.

DETAILED DESCRIPTION OF THE INVENTION

Several embodiments of the present invention will be described below in detail with reference to the accompanying drawings. The same reference numerals denote the same or similar constituent elements throughout the drawings, and a repetitive description thereof will be omitted. Term "group" used here means "group" in a long-period periodic table in which elements are classified into 1 to 18 groups.

Common points of the first and second embodiments will be described first.

Figure 3:
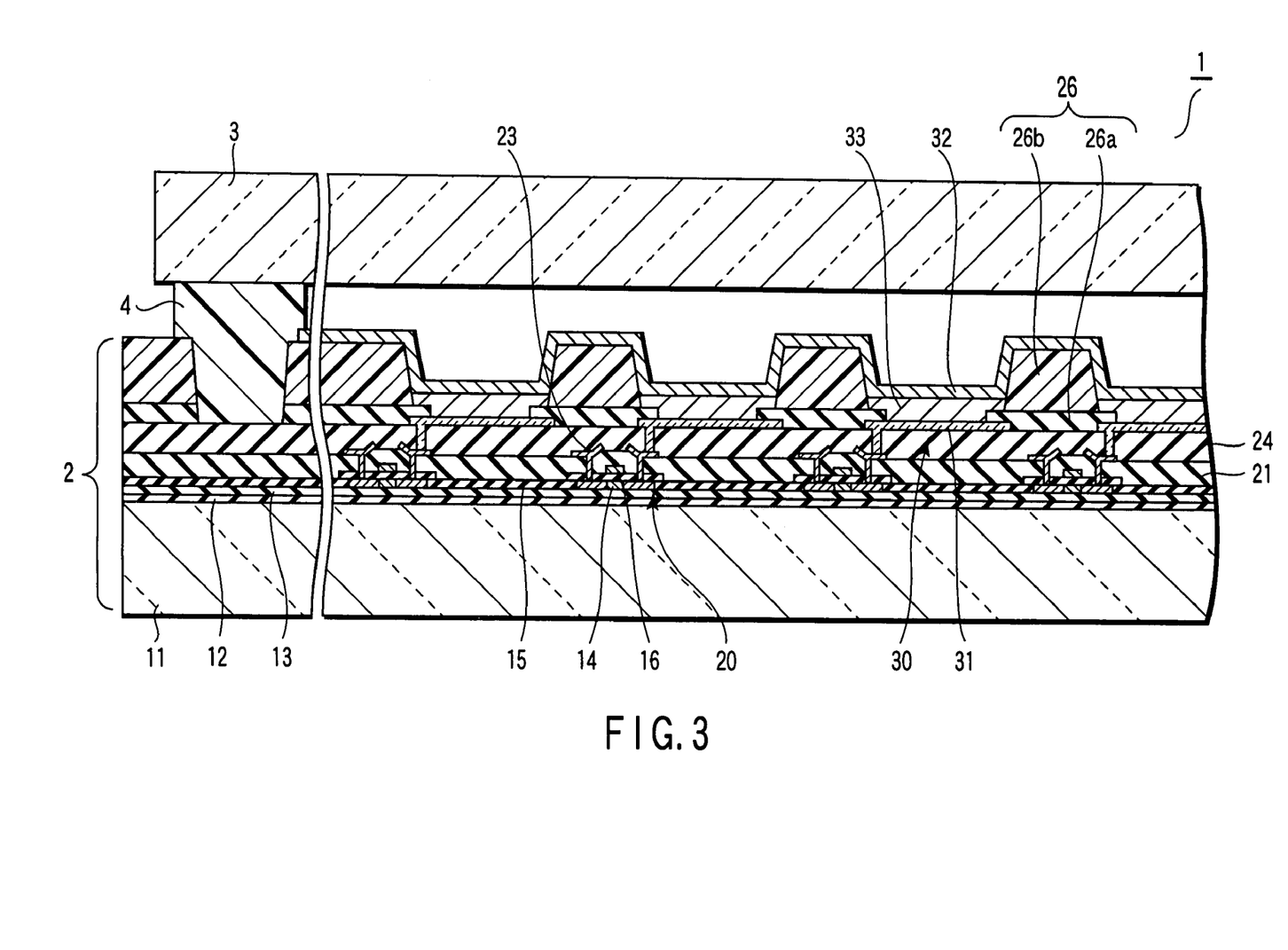
FIG. 3 is a sectional view schematically showing an organic EL display according to first and second embodiments of the present invention.

FIG. 3 is a sectional view schematically showing an organic EL display according to the first and second embodiments of the present invention. In an organic EL display 1 shown in FIG. 3, an array substrate 2 and a sealing substrate 3 face each other with a seal layer 4 therebetween. The seal layer 4 is formed along the periphery of the sealing substrate 3. Accordingly, an enclosed space is formed between the array substrate 2 and the sealing substrate 3. For example, this space is filled with a rare gas such as Ar gas or an inert gas such as $N_2$ gas. The structure may directly be covered with a multilayered film in place of the sealing substrate 3.

The array substrate 2 has a substrate 11 made of, e.g., glass. For example, an $SiN_X$ layer 12 and an $SiO_2$ layer 13 are sequentially formed on the substrate 11 as undercoat layers. Semiconductor layers 14 such as polysilicon layers each having a channel, source, and drain, a gate insulator 15, and gate electrodes 16 are sequentially formed on the undercoat layer 13. These components form top gate thin-film transistors (referred to as TFTs hereinafter) 20. In each TFT 20, an amorphous silicon layer can be used as an active layer in place of the polysilicon layer. The TFT 20 may have an inverted stagger structure in place of the top gate structure.

An interlayer dielectric film 21 made of, e.g., $SiO_2$ is formed on the gate insulator 15 and gate electrodes 16. Electrode interconnections (not shown) and source and drain electrodes 23 are formed on the interlayer dielectric film 21. These components are buried under a passivation film 24 made of, e.g., $SiN_x$. The source and drain electrodes 23 are electrically connected to the sources and drains of the TFTs 20 through contact holes formed in the interlayer dielectric film 21.

Anodes (transparent pixel electrodes) 31 and partition insulating layers 26 are juxtaposed on the passivation film 24. For example, the partition insulating layer 26 has a structure in which a hydrophilic insulating layer 26a made of, e.g., an inorganic insulating material such as silicon nitride or silicon oxide and a water-repellent insulating layer 26b made of, e.g., an organic insulating material are sequentially formed. The partition insulating layer 26 is provides with an opening at a position corresponding to the anode 31.

An organic layer 33 is formed on an exposed portion of the anode 31 in the opening of the partition insulating layer 26. The organic layer 33 includes an organic light-emitting layer which emits light of, e.g., red, green, or blue. The organic layer 33 can further include, between the light-emitting layer and the anode 31, a conductive organic layer which mediates hole injection from the anode 31 to the light-emitting layer, like a hole injection layer or hole transporting layer. The organic layer 33 can further include, between the light-emitting layer and a cathode 32 (described later), a conductive organic layer which mediates electron injection from the cathode 32 to the light-emitting layer, like an electron injection layer.

The cathode 32 serving as a common electrode is formed on the partition insulating layer 26 and organic layers 33. The cathode 32 is electrically connected to a common electrode breakout wiring line through contact holes (not shown) formed in the passivation film 24 and partition insulating layer 26. Each organic EL element 30 includes the anode 31, organic layer 33, and cathode 32.

The first and second embodiments will individually be described next. These embodiments are different only in that different structures are employed for the cathode 32. The structure of the cathode 32 will mainly be described below.

Figure 4:
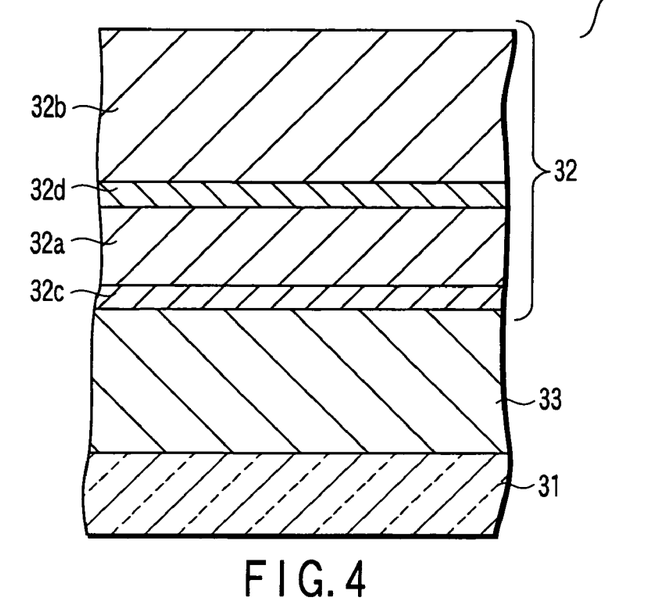
FIG. 4 is a sectional view schematically showing an example of the structure of an organic EL element which can be used in the organic EL display according to the first embodiment of the present invention.

FIG. 4 is a sectional view schematically showing an example of the structure of an organic EL element which can be used in the organic EL display according to the first embodiment of the present invention. In the organic EL element 30 shown in FIG. 4, the cathode 32 includes a main conductor layer 32a facing the organic layer 33, a protective conductor layer 32b disposed on the main conductor layer 32a, a contact layer 32c interposed between the main conductor layer 32a and the organic layer 33, and an outer barrier layer 32d interposed between the main conductor layer 32a and the protective conductor layer 32b.

The main conductor layer 32a is the main portion of the cathode 32 and is made of, e.g., a metal material having a small work function. Examples of the material of the main conductor layer 32a are an elementary metal such as Li, Na, K, Rb, Cs, Mg, Ca, Sr, Ba, Y, La, Ce, Pr, Nd, Sm, Eu, Gd, Tb, Dy, Ho, Er, Tm, Yb, or Lu, each of which is an alkali metal element, alkali earth metal element, or rare earth element, a multi-element metal containing at least one of the above elements, and a multilayered metal containing a plurality of layers of an elementary metal or multi-element metal containing the above element. The thickness of the main conductor layer 32a is normally about 1 nm to 100 nm.

The protective conductor layer 32b protects the main conductor layer 32a and the like from oxidation degradation by contact with water or oxygen and also reduces the resistance of the cathode 32. As the material of the protective conductor layer 32b, for example, a metal material having a larger work function than that of the main conductor layer 32a can be used. Examples of such a metal include Ag and Al. The thickness of the protective conductor layer 32b is normally about 50 nm to 1,000 nm.

The contact layer 32c determines the barrier height for electron injection injected from the cathode 32 into the organic layer 33, as will be described later. The material of the contact layer 32c is a semiconductor or insulator. Many materials suitable for the contact layer 32c have an electron affinity smaller than the work function of the material of the main conductor layer 32a. Many materials suitable for the contact layer 32c are not elementary substances but compounds. Examples of the material of the contact layer 32c include a compound of a group 1 element and a group 16 element, a compound of a group 1 element and a group 17 element, a compound of a group 2 element and a group 17 element, and a compound of a group 1 element, group 2 element, and a group 17 element. The thickness of the contact layer 32c is normally about 0.1 nm to 10 nm. In the first embodiment, the contact layer 32c is an optional constituent element.

The outer barrier layer 32d suppresses the constituent element of the main conductor layer 32a from being diffused into the protective conductor layer 32b and the constituent element of the protective conductor layer 32b from being diffused into the main conductor layer 32a. The material of the outer barrier layer 32d is an inorganic material different from the material of the main conductor layer 32a or protective conductor layer 32b. Typically, the outer barrier layer 32d is made of a semiconductor or insulator. Many materials suitable for the outer barrier layer 32d have an electron affinity smaller than the work function of the material of the main conductor layer 32a or protective conductor layer 32b. Many materials suitable for the outer barrier layer 32d are not elementary substances but compounds. Examples of the material of the outer barrier layer 32d include a compound of a group 1 element and a group 16 element, a compound of a group 1 element and a group 17 element, a compound of a group 2 element and a group 17 element, and a compound of a group 1 element, group 2 element, and a group 17 element.

In this embodiment, for example, the structure shown in FIG. 4 is employed for the organic EL element 30 of the organic EL display 1 shown in FIG. 3. When this structure is employed, an excellent life characteristic can be realized, as will be described below.

In a cathode having the M/Y/X structure shown in FIG. 2, alloying occurs between the low work function metal contained in the Y layer 32y and the high work function metal contained in the M layer 32m immediately after cathode formation. For this reason, the work function of the Y layer 32y gradually increases. Hence, the electron injection barrier increases. That is, the electron injection amount to the organic layer 33 decreases as time elapses. Consequently, a decrease in efficiency or life is caused by the cathode.

Conversely, in the organic EL element 30 shown in FIG. 4, the outer barrier layer 32d suppresses the constituent element of the main conductor layer 32a from being diffused into the protective conductor layer 32b and the constituent element of the protective conductor layer 32b from being diffused into the main conductor layer 32a. Hence, any degradation in cathode structure by alloying between the metal contained in the main conductor layer 32a and the metal contained in the protective conductor layer 32b can be suppressed. Accordingly, any decrease in luminous efficiency or life by the cathode can be suppressed. That is, an excellent life characteristic can be realized.

The following method makes it possible to confirm that the outer barrier layer 32d suppresses alloying between the first metal contained in the protective conductor layer 32b and the second metal contained in the main conductor layer 32a or diffusion of the constituent element of the protective conductor layer 32b into the main conductor layer 32a. More specifically, between the organic EL element 30 having the outer barrier layer 32d and an organic EL element having the same structure except that the outer barrier layer 32d is not formed, the composition of the surface region of the protective conductor layer 32b on the side of the main conductor layer 32a and/or that of the surface region of the main conductor layer 32a on the side of the protective conductor layer 32b is compared after continuously lighting under predetermined conditions.

For example, assume that, after the organic EL element 30 having no outer barrier layer 32d is continuously lit for 100 hrs at room temperature at a current density of 0.1 A/cm$^2$, a ratio of the second concentration to the first concentration is 1/3 or more, and a ratio of the third concentration to the first concentration is 1/5 or more. Note that the first concentration is a concentration of one constituent element, e.g. the second metal, of the main conductor layer 32a in the main conductor layer 32a, the second concentration is a concentration of the above constituent element in a region of the protective conductor layer 32b which is defined as a region from a surface of the protective conductor layer 32b on the side of the main conductor layer 32a to a level spaced apart from the main conductor layer 32a by 2 nm, and the third concentration is a concentration of the above constituent element in a region of the protective conductor layer 32b which is spaced apart from the main conductor layer 32a by 2 nm or more. In this case, if the ratio of the second concentration to the first concentration after continuous lighting under the same conditions as described above is 1/10 or less in the structure having the outer barrier layer 32d, it can be regarded to execute the above-described functions. The concentration ratio can be checked by, e.g., baring a desired section by combining sectional TEM (Transmission Electron Microscope) and FIB (Field Ion Beam) and executing analysis for that section by using AES (Auger Electron Spectroscopy) or EDXD (Energy Dispersive X-ray Diffraction) at a spatial resolution up to, e.g., about 1 nm.

In this embodiment, as described above, the outer barrier layer 32d is interposed between the main conductor layer 32a and the protective conductor layer 32b, thereby suppressing movement of the constituent elements of the main conductor layer 32a and protective conductor layer 32b between them. The barrier function of the outer barrier layer 32d depends on the material used for it. An especially excellent barrier function can often be implemented when a solid-state material which has insulating, semi-insulating, or semi-conductive properties and is stable at room temperature and normal pressure, i.e., an insulator or semiconductor is used as the material of the outer barrier layer 32d. For example, when a compound of a group 1 element and a group 16 element such as Li$_2$O or Na$_2$S, a compound of a group 1 element and a group 17 element such as CsF or CsCl, a compound of a group 2 element and a group 17 element such as BaF$_2$, BaCl$_2$, or BaCl$_x$F$_{2-x}$, or a compound of a group 1 element, group 2 element, and a group 17 element such as KMgF$_3$ is used as the material of the outer barrier layer 32d and, more particularly, when a compound of a group 1 element and a group 17 element such as CsF or CsCl is used, a most excellent barrier function can be realized.

The barrier function of the outer barrier layer 32d also depends on its thickness. Normally, when the thickness of the outer barrier layer 32d is about 1 nm or more, an especially excellent barrier function can often be realized. The above-described material examples of the outer barrier layer 32d have a conductivity lower than that of materials used for the main conductor layer 32a and protective conductor layer 32b by several ten orders of magnitudes. For this reason, when the outer barrier layer 32d is interposed, the operating voltage of the organic EL element 30 may increase, resulting in higher power consumption. However, when the thickness of the outer barrier layer 32d is about 20 nm or less, the voltage drop by the protective conductor layer/outer barrier layer/main conductor layer hardly affects the operating voltage.

In this embodiment, the metal element contained in the main conductor layer 32a is preferably the same as that contained in the outer barrier layer 32d. In this case, the manufacture of the organic EL element 30 is easy. In addition, even when diffusion of the metal elements of the main conductor layer 32a and outer barrier layer 32d occurs between them, their characteristics do not greatly change.

When the following arrangement is employed in the above structure, the above-described degradation of the cathode structure can more effectively be suppressed. In addition, a high luminous efficiency can be realized in all organic EL elements which emit light of different colors, for example, organic EL elements which emit red light, organic EL elements which emit green light, and organic EL elements which emit blue light. Hence, a more excellent life characteristic can be realized. This will be described below in detail.

In studies so far, the function of the X layer 32x in the cathode 32 shown in FIGS. 1 and 2 is not sufficiently clear. According to studies by the present inventors, the X layer 32x determines the difference between the work function of the cathode metal (the Y layer 32y shown in FIGS. 1 and 2) and the bottom of the conduction band of a layer closest to the cathode 32 in the organic layer 33, i.e., the light-emitting layer or electron injection layer. In other words, the X layer 32x determines the electron injection barrier height. As the electron injection barrier height becomes low, the operating voltage becomes low, and electrons are more easily injected to the organic layer 33. However, when LiF is used as the material of the X layer 32x, the barrier height for light-emitting layers whose light emission color is red or green is large. Hence, the operating voltage is high, and the electron injection amount is small.

In the field of semiconductor, various kinds of models which determine the electron injection barrier have been proposed. The present inventors studied the operating voltage by systematically changing the material of the X layer 32x. It was revealed that the two following models were dominant in organic EL elements. The first model is an M/I/S junction model which is known well in the field of semiconductor (in the structure shown in FIG. 1, the M layer, I layer, and S layer of the M/I/S structure correspond to the M layer 32m, X layer 32x, and Y layer 32y, respectively, and in the structure shown in FIG. 2, the M layer, I layer, and S layer of the M/I/S structure correspond to the Y layer 32y, X layer 32x, and organic layer 33, respectively). The second model is a barrier reduction model by an electric double layer at the interface of the X layer 32x (reference about the electric double layer model; T. E. Feuchtwang, D. Paudyal, and W. Pong, Phys. Rev. B 26, 1608 (1982)). The key parameter for the X layer material in the former junction model is mainly the electron affinity. The larger the electron affinity is, the lower the electron injection barrier height and operating voltage become. On the other hand, the key parameter for the X layer material in the latter model is mainly the effective mass of electrons. The smaller the effective mass is, the lower the electron injection barrier height and operating voltage become.

According to the studies by the present inventors, in polymer light-emitting materials, the dominant model of the first and second models changes between the red, green, and blue light-emitting layers. More specifically, in a light-emitting layer which emits red light, the operating voltage has a close correlation with the electron affinity of the X layer material, and the first model is dominant. In a light-emitting layer which emits blue light, the operating voltage has a close correlation with the effective mass, and the second model is dominant. In a light-emitting layer which emits green light, the operating voltage depends on both the electron affinity and the effective mass, and both the first and second models act. The reason why the junction model changes between the red, green, and blue light-emitting layers is still unknown.

As is apparent from the above description, when a material having a large electron affinity and small effective mass of electrons is used as the material of the X layer 32x, which corresponds to the contact layer 32c in the structure shown in FIG. 4, the electron injection barrier height can be reduced in all the red, green, and blue light-emitting layers. For example, when a compound of a group 1 element and a group 16 element such as $Li_2O$ or a compound of a group 1 element and a group 17 element such as CsF or CsCl except LiF and NaF is used as the material of the contact layer 32c, a particularly low electron injection barrier height can be realized in all the red, green, and blue light-emitting layers. Even when the same material is used for the contact layers 32c of red, green, and blue pixels, a high luminous efficiency can be realized in all of the pixels. Hence, a more excellent life characteristic can be realized.

The second embodiment of the present invention will be described next.

As described in the first embodiment, degradation of the cathode caused by, e.g., diffusion of constituent elements between the main conductor layer 32a and the protective conductor layer 32b can be suppressed by inserting the outer barrier layer 32d between them. In the structure shown in FIG. 4, however, degradation of the cathode caused by, e.g., diffusion of constituent elements between the main conductor layer 32a and the contact layer 32c cannot be suppressed. For this purpose, the structure to be described below is effective.

Figure 5:
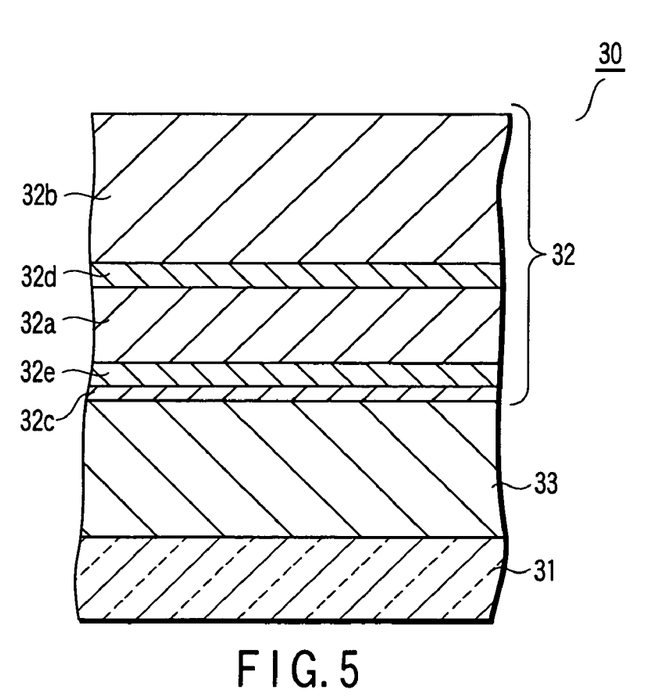
FIG. 5 is a sectional view schematically showing an example of the structure of an organic EL element which can be used in the organic EL display according to the second embodiment of the present invention.

FIG. 5 is a sectional view schematically showing an example of the structure of an organic EL element which can be used in the organic EL display according to the second embodiment of the present invention. An organic EL element 30 shown in FIG. 5 has the same structure as the organic EL element 30 shown in FIG. 4 except that the organic EL element further comprises an inner barrier layer 32e between a main conductor layer 32a and a contact layer 32c.

In the organic EL element 30, the inner barrier layer 32e suppresses the constituent element of the main conductor layer 32a from being diffused into the contact layer 32c and/or the constituent element of the contact layer 32c from being diffused into the main conductor layer 32a. Hence, any degradation of the cathode caused by, e.g., diffusion of constituent elements between the main conductor layer 32a and the contact layer 32c can be suppressed. Accordingly, any decrease in luminous efficiency or life caused by the cathode can be suppressed. That is, an excellent life characteristic can be realized.

Whether the inner barrier layer 32e suppresses diffusion of the constituent elements between the main conductor layer 32a and the contact layer 32c can be confirmed by, e.g., the following method. More specifically, between the organic EL element 30 having the inner barrier layer 32e and an organic EL element having the same structure except that the inner barrier layer 32e is not formed, the composition of the surface region of the contact layer 32c on the side of the main conductor layer 32a and/or that of the surface region of the main conductor layer 32a on the side of the contact layer 32c is compared after continuously lighting under predetermined conditions.

For example, assume that, after the organic EL element 30 having no inner barrier layer 32e is continuously lit under the same conditions as described in the first embodiment, a ratio of the fifth concentration to the fourth concentration is 1/3 or more, and a ratio of the sixth concentration to the fourth concentration is 1/5 or more. Note that the fourth concentration is a concentration of one constituent element, e.g. the second metal, of the main conductor layer 32a in the main conductor layer 32a, the fifth concentration is a concentration of the above constituent element in a region of the contact layer 32c which is defined as a region from a surface of the contact layer 32c on the side of the main conductor layer 32a to a level spaced apart from the main conductor layer 32a by 2 nm, and the sixth concentration is a concentration of the above constituent element in a region of the contact layer 32c which is spaced apart from the main conductor layer 32a by 2 nm or more. In this case, if the ratio of the fifth concentration to the fourth concentration after continuous lighting under the same conditions as described above is 1/10 or less in the structure having the inner barrier layer 32e, it can be regarded to execute the above-described function. The concentration ratio can be checked by, e.g., baring a desired section by combining sectional TEM and FIB and executing analysis for that section by using AES or EDXD at a spatial resolution up to, e.g., about 1 nm.

The inner barrier layer 32e is made of an inorganic material different from the material of the main conductor layer 32a or contact layer 32c. The barrier function of the inner barrier layer 32e depends on the material used for it or the combination of the material used for it and the material used for the main conductor layer 32a or contact layer 32c. An especially excellent barrier function can be implemented when a solid-state material which has insulating, semi-insulating, or semi-conductive properties and is stable at room temperature and normal pressure, i.e., an insulator or semiconductor is used as the material of the inner barrier layer 32e. Many materials suitable for the inner barrier layer 32e have an electron affinity smaller than the work function of the material of the main conductor layer 32a or the electron affinity of the material of the contact layer 32c. Alternatively, the materials is larger in an effective mass of electron than the contact layer 32c. Many materials suitable for the inner barrier layer 32e are not elementary substances but compounds.

When a compound of a group 1 element and a group 16 element such as $Li_2O$ or $Na_2S$, a compound of a group 1 element and a group 17 element such as CsF or CsCl, a compound of a group 2 element and a group 17 element such as $BaF_2$, $BaCl_2$, or $BaCl_xF_{2-x}$, or a compound of a group 1 element, group 2 element, and a group 17 element such as $KMgF_3$ is used as the material of the inner barrier layer 32e, an excellent barrier function can often be realized, although it changes depending on the combination of the materials used for the main conductor layer 32a and contact layer 32c.

The barrier function of the inner barrier layer 32e also depends on its thickness. Normally, when the thickness of the inner barrier layer 32e is about 1 nm or more, an especially excellent barrier function can be realized.

The above-described material examples of the inner barrier layer 32e and the materials used for the contact layer 32c have a conductivity lower than that of materials used for the main conductor layer 32a by several ten orders of magnitudes. For this reason, when the inner barrier layer 32e is additionally interposed, the operating voltage (power consumption) of the organic EL element 30 may increase. However, normally, when the total thickness of the inner barrier layer 32e and contact layer 32c falls within the range of 0.1 to 10 nm, the voltage drop generated by forming the inner barrier layer 32e hardly affects the operating voltage.

Assume that the above-described materials and, for example, Ba and CsF are used as the materials of the main conductor layer 32a and contact layer 32c, respectively. When a compound of a group 2 element and a group 17 element such as $BaF_2$ (different from the material of the contact layer 32c) is used as the material of the inner barrier layer 32e, the electron injection barrier height can satisfactorily balance between the red, green, and blue light-emitting layers. Hence, a more excellent life characteristic can be realized.

As compared to a case in which the metal element contained in the main conductor layer 32a is the same as that contained in the contact layer 32c, the degradation of a cathode 32 caused by diffusion of constituent elements between the main conductor layer 32a and the contact layer 32c is much more serious when the metal elements are different. Hence, the inner barrier layer 32e is especially useful in the latter case.

In this embodiment, the material of an outer barrier layer 32d is preferably the same as that of the inner barrier layer 32e. The organic EL element 30 having this structure can easily be manufactured.

In this embodiment, the metal element contained in the main conductor layer 32a is preferably the same as that contained in the outer barrier layer 32d. In this case, the manufacture of the organic EL element 30 is easy, as described above. In addition, even when diffusion of metal elements of the main conductor layer 32a and outer barrier layer 32d occurs between them, their characteristics do hot greatly change. Similarly, in this embodiment, the metal element contained in the main conductor layer 32a is preferably the same as that contained in the inner barrier layer 32e. In this case, the manufacture of the organic EL element 30 is easy. In addition, even when diffusion of metal elements of the main conductor layer 32a and inner barrier layer 32e occurs between them, their characteristics do not greatly change.

In the second embodiment, the outer barrier layer 32d and protective conductor layer 32b are optional constituent elements. That is, the outer barrier layer 32d need not always be interposed between the main conductor layer 32a and the protective conductor layer 32b. In addition, the outer barrier layer 32d and protective conductor layer 32b need not always be formed on the main conductor layer 32a.

The layers which form the cathode 32 described in the first and second embodiments can be formed by using a vapor deposition method such as evaporation. When the contact layer 32c is to be formed by evaporation, the deposition rate is preferably set to 0.05 Å/sec or less. This will be described with reference to FIG. 6.

Figure 6:
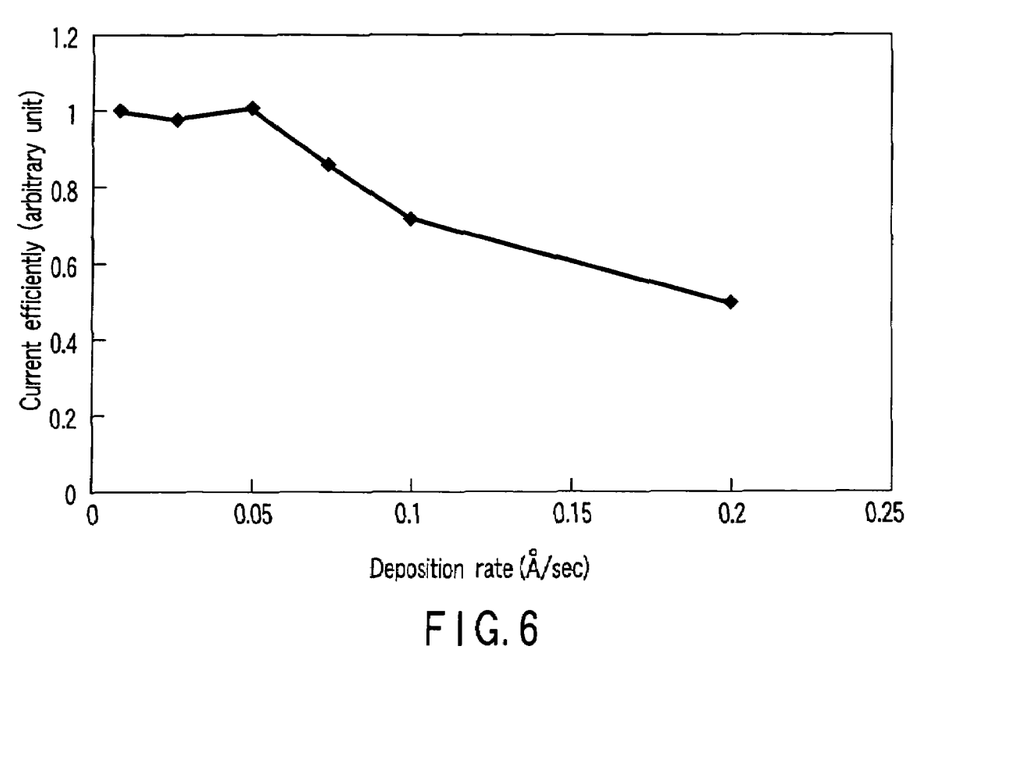
FIG. 6 is a graph showing an example of the relationship between the current efficiency of the organic EL element and the deposition rate in forming a contact layer.

FIG. 6 is a graph showing an example of the relationship between the current efficiency of the organic EL element 30 and the deposition rate in forming the contact layer 32c. Referring to FIG. 6, the abscissa represents the deposition rate in forming the contact layer 32c of the cathode 32 shown in FIG. 4. The ordinate represents the current efficiency of the organic EL element 30 made by forming the contact layer 32c at that deposition rate. FIG. 6 shows data obtained when only the deposition rate is changed while keeping the thickness of the contact layer 32c constant.

As shown in FIG. 6, when the deposition rate is higher than 0.05 Å/sec, the current efficiency decreases as the deposition rate becomes high. Conversely, when the deposition rate is 0.05 Å/sec or less, a high current efficiency can be realized regardless of the deposition rate.

In the above embodiments, an anode 31 is formed on a passivation film 24. The anode 31 may be formed on an interlayer dielectric film 21. That is, the signal line and anode 31 may be formed on the same plane. In the above embodiment, the organic EL display 1 is of a bottom emission type. Instead, the organic EL display 1 may be of a top emission type. When an array substrate 2 is to be sealed by a counter substrate 3, the life of the elements can be prolonged by encapsulating a desiccant in the space between the substrates. Alternatively, the heat dissipation characteristic may be increased by filling the space between the counter substrate 3 and the array substrate 2 with a resin. In the above embodiment, the organic EL element 30 includes the protective conductor layer 32b. However, the protective conductor layer 32b need not always be formed. For example, when a plurality of, two organic layers 33 are stacked, the cathode 32 is interposed between them, and the stack body is sandwiched between a pair of anodes 31, the protective conductor layer 32b need not be formed.

Examples of the present invention will be described below.

EXAMPLE 1

In this example, an organic EL display 1 shown in FIG. 3 was manufactured by a method to be described below. In this example, the structure shown in FIG. 4 was employed for an organic EL element 30. In this example, the diagonal size of the display area was 2.2 inches, and the definition was 130 ppi (pixels per inch). In this example, the organic EL elements 30 included three kinds of elements which emitted red, green, and blue light so that the organic EL display 1 was a full-color display.

Film formation and patterning were repeatedly executed for a surface of a substrate 11 on which undercoat layers 12 and 13 were formed, as in a normal TFT formation process, to form TFTs 20, interlayer dielectric film 21, electrode interconnection (not shown), common electrode breakout wiring line (not shown), source and drain electrodes 23, and passivation film 24.

An ITO film was formed on the passivation film 24 by sputtering. The ITO film was patterned by photolithography to obtain anodes 31. The anodes 31 may be formed by mask sputtering.

A hydrophilic layer 26a provided with openings at positions corresponding to the light-emitting portions of pixels was formed on the surface of the substrate 11 on which the anodes 31 were formed. A photosensitive resin was applied to the surface of the substrate 11 on which the anodes 31 were formed. A resultant coating was subjected to pattern-exposure and developing to form a water-repellent layer 26b having openings at positions corresponding to the light-emitting portions of pixels.

In the above-described way, a partition insulating layer 26 including the hydrophilic layer 26a and water-repellent layer 26b was obtained. Surface treatment using $CF_4/O_2$ gas was executed for the substrate 11 on which the partition insulating layer 26 was formed, thereby fluorinating the surface of the water-repellent layer 26b.

Buffer layer forming ink was discharged by inkjet to each liquid reservoir formed by the partition insulating layer 26. Resultant liquid films were heated to form buffer layers. Subsequently, red, green, and blue light-emitting layer formation inks were discharged by inkjet onto the buffer layers corresponding to the red, green, and blue pixels. Resultant liquid films were heated to form light-emitting layers. In the above way, organic layers 33 were obtained.

Next, LiF, Ba, $BaF_2$, and Al were sequentially formed by vacuum evaporation on the surface of the substrate 11 on which the organic layers 33 were formed (the electron affinity of $BaF_2$ is smaller than the work function of Ba and that of Al, and the electron affinity of LiF is smaller than the work function of Ba). With this process, a cathode 32 sequentially including a contact layer 32c, main conductor layer 32a, outer barrier layer 32d, and protective conductor layer 32b, as shown in FIG. 4, was obtained. In this example, the thickness of the contact layer 32c was 0.5 nm. The thickness of the main conductor layer 32a was 7 nm. The thickness of the outer barrier layer 32d was 2 nm. The thickness of the protective conductor layer 32b was 300 nm. A TFT array substrate 2 was thus completed.

After that, a UV curing resin was applied to the periphery of one major surface of a glass substrate 3 to form a seal layer 4. The glass substrate 3 and array substrate 2 were bonded in a dry nitrogen atmosphere such that the surface of the glass substrate 3 with the seal layer 4 faced the surface of the array substrate 2 with the cathode 32. The seal layer was cured by UV irradiation, thereby completing the organic EL display 1 shown in FIG. 3.

For the organic EL display 1, the luminous efficiencies and emission lives in monochrome lighting were measured. In measuring, the drive current was set such that the initial luminance of each of the organic EL elements 30 which emitted red, green, and blue light became 200 $cd/cm^2$. The emission life was defined as the time until the luminance decreased to ½ of the initial luminance. Table 1 shows the results.

TABLE 1

| Organic EL element | | Luminous efficiency (cd/A) | Emission life (hour) |
|---|---|---|---|
| Emission color | Red | 1.2 | 11,423 |
| | Green | 8.8 | 12,051 |
| | Blue | 2.6 | 15,672 |

As shown in Table 1, the luminous efficiencies of the red and blue organic EL elements 30 were lower than that of the green organic EL element 30. The emission lives exceeded 11,000 hrs in all the organic EL elements 30. That is, an excellent life characteristic could be realized.

Next, the organic EL display 1 manufactured in accordance the same procedures as described above was continuously lit for 100 hrs at room temperature at a current density of 0.1 $A/cm^2$. The ratio of the Ba concentration in a region of the protective conductor layer 32b, which is a region from a surface of the protective conductor layer 32b on the side of the main conductor layer 32a to a level spaced apart from the main conductor layer 32a by 2 nm, with respect to the Ba concentration in the main conductor layer 32a was checked. In addition, the ratio of the Al concentration in a region of the main conductor layer 32a, which is a region from a surface of the main conductor layer 32a on the side of the protective conductor layer 32b to a level spaced apart from the protective conductor layer 32b by 2 nm, with respect to the Al concentration in the protective conductor layer 32b was checked. The ratios were lower than 1/10.

For the organic EL display 1 after continuous lighting, the ratio of the Ba concentration in a region of the contact layer 32c, which is a region from a surface of the contact layer 32c on a side of the main conductor layer 32a to a level spaced apart from the main conductor layer 32a by 2 nm, with respect to the Ba concentration in the main conductor layer 32a was checked. In addition, the ratio of the Li concentration in a region of the main conductor layer 32a, which is a region from a surface of the main conductor layer 32a on a side of the contact layer 32c to a level spaced apart from the contact layer 32c by 2 nm, with respect to the Li concentration in the contact layer 32c was checked. The ratios were higher than 1/3.

Furthermore, the ratio of the Ba concentration in a region of the contact layer 32c, which is a region spaced apart from the conductor layer 32a by 2 nm or more, with respect to the Ba concentration in the main conductor layer 32a was checked. The ratio of the Li concentration in a region of the main conductor layer 32a, which is a region spaced apart from the contact layer 32c by 2 nm or more, with respect to the Li concentration in the contact layer 32c was checked. The ratios were higher than 1/5.

Comparative Example

An organic EL display 1 shown in FIG. 3 was manufactured in accordance with the same procedures as described in Example 1 except that the structure shown in FIG. 2 was employed for an organic EL element 30. In this example, LiF, Ba, and Al were used as the materials of an X layer 32x, Y layer 32y, and M layer 32m. The thicknesses of the X layer 32x, Y layer 32y, and M layer 32m were the same as those of the contact layer 32c, main conductor layer 32a, and protective conductor layer 32b of the organic EL element 30 of Example 1.

For the organic EL display 1, the luminous efficiencies and emission lives were measured under the same conditions as described above. Table 2 shows the results.

TABLE 2

| Organic EL element | | Luminous efficiency (cd/A) | Emission life (hour) |
|---|---|---|---|
| Emission color | Red | 1.0 | 6,250 |
| | Green | 7.0 | 5,968 |
| | Blue | 2.4 | 11,518 |

As shown in Table 2, in the organic EL display 1 of this comparative example, the efficiencies were about 80% of those in the organic EL display 1 of Example 1, and the lives were about 60% in all of the red, green, and blue organic EL elements 30. As is apparatus from this result, the barrier layer 32d is very useful in increasing the luminous efficiency and emission life.

Next, the organic EL display 1 manufactured in accordance the same procedures as described above was continuously lit under the same conditions as described above. The ratio of the Ba concentration in a region of the M layer 32m, which is a region from a surface of the M layer 32m on a side of the Y layer 32y to a level spaced apart from the Y layer 32y by 2 nm, with respect to the Ba concentration in the Y layer 32y was checked. In addition, the ratio of the Al concentration in a region of the Y layer 32y, which is a region from a surface of the Y layer 32y on a side of the M layer 32m to a level spaced apart from the M layer 32m by 2 nm, with respect to the Al concentration in the M layer 32m was checked. The ratios were higher than 1/3.

The ratio of the Ba concentration in a region of the M layer 32m, which is a region spaced apart from the Y layer 32y by 2 nm or more, with respect to the Ba concentration in the Y layer 32y was checked. In addition, the ratio of the Al concentration in a region of the Y layer 32y, which is a region spaced apart from the M layer 32m by 2 nm or more, with respect to the Al concentration in the M layer 32m was checked. The ratios were higher than 1/5.

Furthermore, the ratio of the Ba concentration in a region of the X layer 32x, which is a region from a surface of the X layer 32x on the side of the Y layer 32y to a level spaced apart from the Y layer 32y by 2 nm, with respect to the Ba concentration in the Y layer 32y was checked. The ratio of the Li concentration in a region of the Y layer 32y, which is a region from a surface of the Y layer 32y on the side of the X layer 32x to a level spaced apart from the X layer 32x by 2 nm, with respect to the Li concentration in the X layer 32x was checked. The ratios were higher than 1/3.

The ratio of the Ba concentration in a region of the X layer 32x, which is a region spaced apart from the Y layer 32y by 2 nm or more, with respect to the Ba concentration in the Y layer 32y was checked. In addition, the ratio of the Li concentration in a region of the Y layer 32y, which is a region spaced apart from the X layer 32x by 2 nm or more, with respect to the Li concentration in the X layer 32x was checked. The ratios were higher than 1/5.

EXAMPLE 2

An organic EL display 1 shown in FIG. 3 was manufactured in accordance with the same procedures as described in Example 1 except that CsF was used as the material of a contact layer 32c. Even for the organic EL display 1, the luminous efficiencies and emission lives were measured under the same conditions as described above. Table 3 shows the results.

TABLE 3

|  | Organic EL element | Luminous efficiency (cd/A) | Emission life (hour) |
|---|---|---|---|
| Emission color | Red | 2.1 | 23,115 |
|  | Green | 14.2 | 19,363 |
|  | Blue | 2.8 | 16,844 |

As shown in Table 3, in the organic EL display 1 of this example, the efficiency of the red organic EL element 30 was about 180% of that in the organic EL display 1 of Example 1. The efficiency of the green organic EL element 30 was about 160%. The life of the red organic EL element 30 was about 200% of that in the organic EL display 1 of Example 1. The life of the green organic EL element 30 was about 160%. As is apparent from the above result, when the material of the contact layer 32c is appropriately selected, the luminous efficiency and emission life can greatly be increased.

Next, the organic EL display 1 manufactured in accordance the same procedures as described above was continuously lit under the same conditions as described above. The ratio of the Ba concentration in a region of the protective conductor layer 32b, which is a region from a surface of the protective conductor layer 32b on a side of a main conductor layer 32a to a level spaced apart from the main conductor layer 32a by 2 nm, with respect to the Ba concentration in the main conductor layer 32a was checked. In addition, the ratio of the Al concentration in a region of the main conductor layer 32a, which is a region from a surface of the main conductor layer 32a on a side of the protective conductor layer 32b to a level spaced apart from the protective conductor layer 32b by 2 nm, with respect to the Al concentration in the protective conductor layer 32b was checked. The ratios were lower than 1/10.

The ratio of the Ba concentration in a region of the contact layer 32c, which is a region from a surface of the contact layer on a side of the main conductor layer 32a to a level spaced apart from the main conductor layer 32a by 2 nm, with respect to the Ba concentration in the main conductor layer 32a was checked. In addition, the ratio of the Cs concentration in a region of the main conductor layer 32a, which is a region from a surface of the main conductor layer 32a on a side of the contact layer 32c to a level spaced apart from the contact layer 32c by 2 nm, with respect to the Cs concentration in the contact layer 32c was checked. The ratios were higher than 1/3.

Furthermore, the ratio of the Ba concentration in region of the contact layer 32c, which is a region spaced apart from the main conductor layer 32a by 2 nm or more, with respect to the Ba concentration in the main conductor layer 32a was checked. The ratio of the Cs concentration in a region of the main conductor layer 32a, which is a region spaced apart from the contact layer 32c by 2 nm or more, with respect to the Cs concentration in the contact layer 32c was checked. The ratios were higher than 1/5.

EXAMPLE 3

An organic EL display 1 shown in FIG. 3 was manufactured in accordance with the same procedures as described in Example 1 except that the structure shown in FIG. 5 was employed for an organic EL element 30. In this example, CsF, $BaF_2$, Ba, $BaF_2$, and Al were used as the materials of a contact layer 32c, inner barrier layer 32e, main conductor layer 32a, outer barrier layer 32d, and protective conductor layer 32b, respectively (the electron affinity of $BaF_2$ is smaller than that of CsF, and the effective mass of electron in CsF is smaller than that in $BaF_2$). In this embodiment, the thickness of the contact layer 32c was 0.5 nm. The thickness of the inner barrier layer 32e was 2 nm. The thickness of the main conductor layer 32a was 7 nm. The thickness of the outer barrier layer 32d was 2 nm. The thickness of the protective conductor layer 32b was 300 nm.

For the organic EL display 1, the luminous efficiencies were measured under the same conditions as described above. Table 4 shows the results. Table 4 also shows the luminous efficiencies obtained for the organic EL display 1 of Example 2. Referring to Table 4, numerical values in parenthesis indicate standard deviations.

TABLE 4

|  |  | Luminous efficiency (cd/A) | |
|---|---|---|---|
|  | Organic EL element | Example 2 | Example 3 |
| Emission color | Red | 2.1 (0.3) | 1.9 (0.23) |
|  | Green | 14.2 (2.24) | 13.2 (2.88) |
|  | Blue | 2.8 (0.38) | 4.1 (0.87) |

As shown in Table 4, the luminous efficiencies of the red and green organic EL elements 30 had no statistical difference between the organic EL display 1 of Example 2 and the organic EL display 1 of Example 3. However, the luminous efficiency of the blue organic EL element 30 was significantly higher in the organic EL display 1 of Example 3 than in the organic EL display 1 of Example 2.

For the organic EL display 1 of this example, the emission lives were measured under the same conditions as described above. As a result, the emission lives of the red and green organic EL elements 30 were almost the same between the organic EL display 1 of Example 2 and the organic EL display 1 of Example 3. However, the emission life of the blue organic EL element 30 was higher in the organic EL display 1 of Example 3 than in the organic EL display 1 of Example 2. As is apparent from the above result, when the outer barrier layer 32d and inner barrier layer 32e are interposed between the protective conductor layer 32b and the main conductor layer 32a and between the main conductor layer 32a and the contact layer 32c, respectively, the luminous efficiency and emission life can further be increased.

The organic EL display 1 manufactured in accordance the same procedures as described above was continuously lit under the same conditions as described in Example 1. The ratio of the Ba concentration in a region of the protective conductor layer 32b, which is a region from a surface of the protective conductor layer 32b on a side of the main conductor layer 32a to a level spaced apart from the main conductor layer 32a by 2 nm, with respect to the Ba concentration in the main conductor layer 32a was checked. In addition, the ratio of the Al concentration in a region of the main conductor layer 32a, which is a region from a surface of the main conductor layer 32a on a side of the protective conductor layer 32b to a level spaced apart from the protective conductor layer 32b by 2 nm, with respect to the Al concentration in the protective conductor layer 32b was checked. The ratios were lower than 1/10.

The ratio of the Ba concentration in a region of the contact layer 32c, which is a region from a surface of the contact layer 32c on a side of the main conductor layer 32a to a level spaced apart from the main conductor layer 32a by 2 nm, with respect to the Ba concentration in the main conductor layer 32a was checked. In addition, the ratio of the Cs concentration in a region of the main conductor layer 32a, which is a region from a surface of the main conductor layer 32a on a side of the contact layer 32c to a level spaced apart from the contact layer 32c by 2 nm, with respect to the Cs concentration in the contact layer 32c was checked. The ratios were smaller than 1/10.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic EL element comprising an anode, a cathode which faces the anode, and an organic layer which is interposed between the anode and the cathode and includes a light emitting layer,
    wherein the cathode comprises a protective conductor layer which faces the organic layer, a main conductor layer which is interposed between the protective conductor layer and the organic layer, and a first barrier layer which is interposed between the protective conductor layer and the main conductor layer and made of an insulator or a semiconductor, and
    an electron affinity of the first barrier layer is smaller than a work function of the protective conductor layer and a work function of the main conductor layer.

2. An organic EL element comprising an anode, a cathode which faces the anode, and an organic layer which is interposed between the anode and the cathode and includes a light emitting layer,
    wherein the cathode comprises a protective conductor layer which faces the organic layer, a main conductor layer which is interposed between the protective conductor layer and the organic layer, and a first barrier layer which is interposed between the protective conductor layer and the main conductor layer and made of an insulator or a semiconductor, and
    the first barrier layer contains a compound selected from the group consisting of a compound of a group 1 element and a group 16 element, a compound of a group 1 element and a group 17 element, a compound of a group 2 element and a group 17 element, and a compound of a group 1 element, group 2 element, and a group 17 element.

3. An organic EL element comprising an anode, a cathode which faces the anode, and an organic layer which is interposed between the anode and the cathode and includes a light emitting layer
    wherein the cathode comprises a protective conductor layer which faces the organic layer, a main conductor layer which is interposed between the protective conductor layer and the organic layer, and a first barrier layer which is interposed between the protective conductor layer and the main conductor layer and made of an insulator or a semiconductor, and
    the cathode further comprises a contact layer which is interposed between the main conductor layer and the organic layer and made of an insulator or a semiconductor.

4. An organic EL element according to claim 3, wherein the cathode further comprises a second bamer layer which is interposed between the main conductor layer and the contact layer and made of an insulator or a semiconductor, and a material of the contact layer is different from a material of the second barrier layer.

5. An organic EL element according to claim 4, wherein a material of the first barrier layer is the same as the material of the second barrier layer.

6. An organic EL element according to claim 4, wherein the first barrier layer, the main conductor layer, and the second barrier layer contain the same metal element.

7. An organic EL element according to claim 4, wherein an electron affinity of the second barrier layer is smaller than a work function of the main conductor layer and an electron affinity of the contact layer.

8. An organic EL element according to claim 4, wherein an effective mass of electron in the second barrier layer is larger than an effective mass of election in the contact layer.

9. An organic EL element according to claim 4, wherein the second barrier layer contains a compound selected from the group consisting of a compound of a group 1 element and a group 16 element, a compound of a group 1 element and a group 17 element, a compound of a group 2 element and a group 17 element, and a compound of a group 1 element, group 2 element, and a group 17 element.

10. An organic EL element according to claim 4, wherein the second barrier layer is thicker than the contact layer.

11. An organic EL element according to claim 3, wherein the contact layer contains a compound containing a group 1 element and a group 17 element.

12. An organic EL element comprising an anode, a cathode which faces the anode, and an organic layer which is interposed between the anode and the cathode and includes a light emitting layer,
wherein the cathode comprises a protective conductor layer which faces the organic layer, a main conductor layer which is interposed between the protective conductor layer and the organic layer and made of a material different from a material of the protective conductor layer, and a first barrier layer which is interposed between the protective conductor layer and the main conductor layer and suppresses diffusion of a constituent element of the protective conductor layer into the main conductor layer, and
the cathode further comprises a contact layer which is interposed between the main conductor layer and the organic layer and made of a semiconductor or an insulator, and a second barrier layer which is interposed between the main conductor layer and the contact layer and suppresses diffusion of a constituent element of the main conductor layer into the contact layer and/or diffusion of a constituent element of the contact layer into the main conductor layer.

13. An organic EL element comprising an anode, a cathode which faces the anode, and an organic layer which is interposed between the anode and the cathode and includes a light emitting layer,
wherein the cathode comprises a main conductor layer which faces the organic layer, a contact layer which is interposed between the main conductor layer and the organic layer and made of a semiconductor or an insulator, and a second barrier layer which is interposed between the main conductor layer and the contact layer and made of a semiconductor or an insulator, a material of the contact layer being different from a material of the second barrier layer.

14. An organic EL element according to claim 13, wherein the cathode further comprises a protective conductor layer on the main conductor layer, which is made of a material different from a material of the main conductor layer.

15. An organic EL element according to claim 13, wherein an electron affinity of the second barrier layer is smaller than a work function of the main conductor layer and an electron affinity of the contact layer.

16. An organic EL element according to claim 13, wherein an effective mass of electron in the second barrier layer is larger than an effective mass of electron in the contact layer.

17. An organic EL element according to claim 13, wherein the contact layer contains a compound containing a group 1 element and a group 17 element.

18. An organic EL element according to claim 13, wherein the second barrier layer contains a compound selected from the group consisting of a compound of a group 1 element and a group 16 element, a compound of a group 1 element and a group 17 element, a compound of a group 2 element and a group 17 element, and a compound of a group 1 element, group 2 element, and a group 17 element.

19. An organic EL element according to claim 13, wherein the second barrier layer is thicker than the contact layer.

20. An organic EL element comprising an anode, a cathode which faces the anode, and an organic layer which is interposed between the anode and the cathode and includes a light emitting layer,
wherein the cathode comprises a main conductor layer which faces the organic layer, a contact layer which is interposed between the main conductor layer and the organic layer and made of a semiconductor or an insulator, and a second barrier layer which is interposed between the main conductor layer and the contact layer and suppresses diffusion of a constituent element of the main conductor layer into the contact layer and/or diffusion of a constituent element of the contact layer into the main conductor layer, a material of the contact layer being different from a material of the second barrier layer.

21. An organic EL display comprising a plurality of organic EL elements according to any one of claims 1, 2, 3 to 11 and 12 to 20, and a substrate which supports the organic EL elements.

22. An organic EL display according to claim 21, wherein the plurality of organic EL elements include first to third organic EL elements whose light emitting layers emit light of different colors.

23. An organic EL display comprising a plurality of organic EL elements according to any one of claims 4 to 10 and 12 to 20, and a substrate which supports the organic EL elements, wherein the plurality of organic EL elements include first to third organic EL elements whose light emitting layers emit light of different colors, a material of the contact layer is the same in the first to third organic EL elements, and a material of the second barrier layer is the same in the first to third organic EL elements.

* * * * *